(12) United States Patent
Baselmans

(10) Patent No.: US 8,692,974 B2
(45) Date of Patent: Apr. 8, 2014

(54) LITHOGRAPHIC APPARATUS AND DEVICE MANUFACTURING METHOD USING PUPIL FILLING BY TELECENTRICITY CONTROL

(75) Inventor: Johannes Jacobus Matheus Baselmans, Orischot (NL)

(73) Assignee: ASML Netherlands B.V., Veldhoven (NL)

( * ) Notice: Subject to any disclaimer, the term of this patent is extended or adjusted under 35 U.S.C. 154(b) by 676 days.

(21) Appl. No.: 11/763,274

(22) Filed: Jun. 14, 2007

(65) Prior Publication Data

US 2008/0309898 A1 Dec. 18, 2008

(51) Int. Cl.
*G03B 27/68* (2006.01)
*G03B 27/54* (2006.01)
*G03B 27/32* (2006.01)
*G03B 27/42* (2006.01)
*G03B 27/52* (2006.01)
*G03B 27/72* (2006.01)

(52) U.S. Cl.
USPC ............. 355/52; 355/53; 355/55; 355/67; 355/71; 355/77

(58) Field of Classification Search
USPC .......... 355/52, 55, 67–71, 53, 77; 359/299, 359/302, 315, 316, 318, 223.1, 225.1, 291, 359/290, 792.1, 492.2, 492.22; 430/5, 8, 430/30, 311; 356/520, 521
See application file for complete search history.

(56) References Cited

U.S. PATENT DOCUMENTS

| | | | |
|---|---|---|---|
| 4,413,909 A * | 11/1983 | Pohle | 356/521 |
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,798,824 A * | 8/1998 | Kudo | 355/67 |
| 5,808,797 A | 9/1998 | Bloom et al. | |
| 5,982,553 A | 11/1999 | Bloom et al. | |
| 6,100,978 A * | 8/2000 | Naulleau et al. | 356/498 |
| 6,133,986 A | 10/2000 | Johnson | |

(Continued)

FOREIGN PATENT DOCUMENTS

DE 103 16 123 A1 10/2004
EP 1 063 570 A2 12/2000

(Continued)

OTHER PUBLICATIONS

Non-Final Rejection mailed Aug. 20, 2009 for U.S. Appl. No. 11/763,275, 12 pgs.

(Continued)

*Primary Examiner* — Toan Ton
*Assistant Examiner* — Christina Riddle
(74) *Attorney, Agent, or Firm* — Sterne, Kessler, Goldstein & Fox P.L.L.C.

(57) ABSTRACT

A method of measuring aberration present in a lithographic apparatus comprising the following steps. Modulating a radiation beam using a reflective patterning device. Projecting the radiation beam using a projection system. Detecting the projected radiation using a sensor. Measuring aberration via interference in the detected radiation beam. The radiation beam is tilted away from the optical axis of the projection system prior to entering the projection system.

19 Claims, 6 Drawing Sheets

(56) References Cited

U.S. PATENT DOCUMENTS

Figure 1:
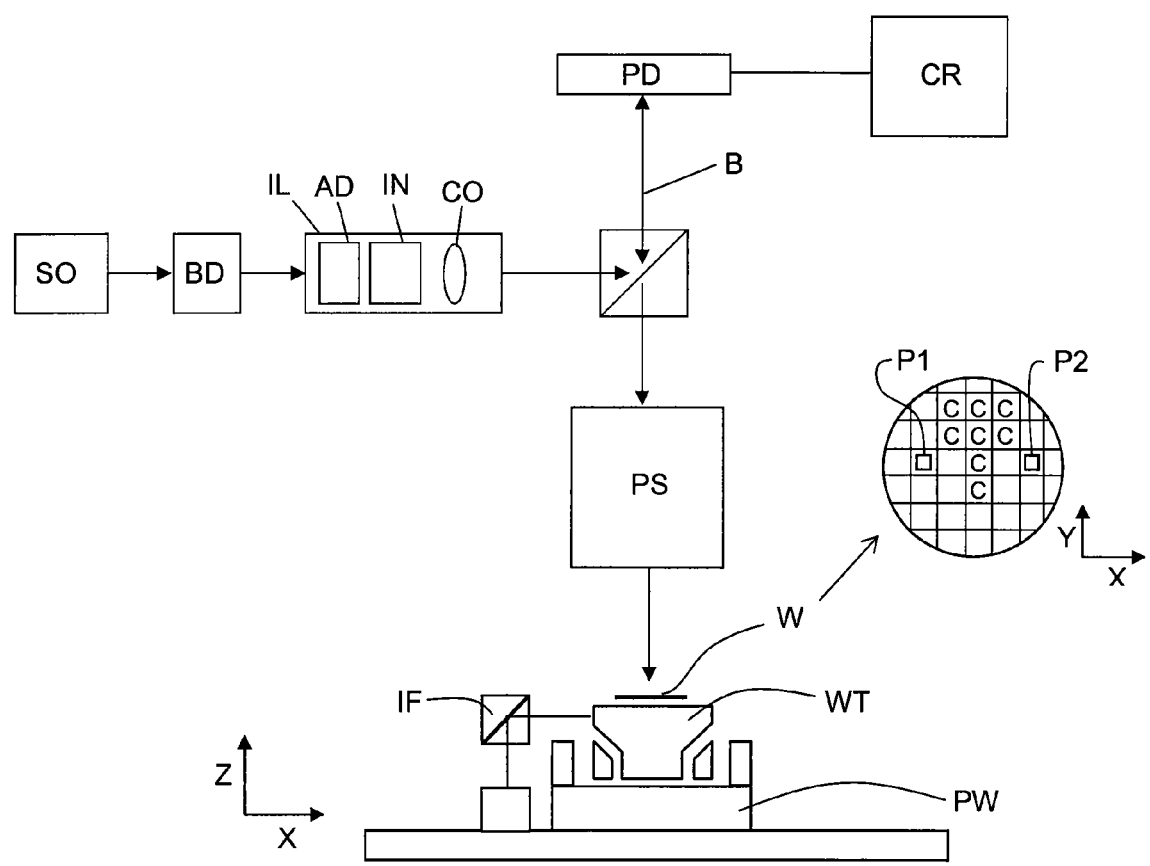

| | | | |
|---|---|---|---|
| 6,177,980 B1 | 1/2001 | Johnson | |
| 6,233,056 B1 | 5/2001 | Naulleau et al. | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,798,494 B2* | 9/2004 | Naulleau | 355/67 |
| 6,806,897 B2 | 10/2004 | Kataoka et al. | |
| 6,811,953 B2 | 11/2004 | Hatada et al. | |
| 6,812,477 B2 | 11/2004 | Matsunami | |
| 6,963,391 B2 | 11/2005 | Van Der Werf et al. | |
| 7,067,784 B1 | 6/2006 | Lowans | |
| 7,088,488 B2 | 8/2006 | Edwards | |
| 7,354,169 B2 | 4/2008 | Baba-Ali | |
| 7,417,745 B2 | 8/2008 | Haidner et al. | |
| 7,520,626 B2 | 4/2009 | Baba-Ali | |
| 7,580,559 B2 | 8/2009 | Latypov et al. | |
| 2004/0041104 A1 | 3/2004 | Liebregts et al. | |
| 2004/0114119 A1* | 6/2004 | Van Der Laan et al. | 355/67 |
| 2004/0130561 A1 | 7/2004 | Jain | |
| 2005/0007572 A1 | 1/2005 | George et al. | |
| 2005/0053273 A1 | 3/2005 | Ostrom et al. | |
| 2005/0168790 A1* | 8/2005 | Latypov et al. | 359/239 |
| 2005/0179977 A1 | 8/2005 | Chui et al. | |
| 2005/0200940 A1* | 9/2005 | Emer | 359/299 |
| 2005/0219502 A1* | 10/2005 | Sandstrom et al. | 355/77 |
| 2005/0254024 A1* | 11/2005 | Van Greevenbroek et al. | 355/30 |
| 2005/0259269 A1 | 11/2005 | Latypov et al. | |
| 2006/0001890 A1* | 1/2006 | Poultney | 356/521 |
| 2006/0012779 A1 | 1/2006 | Hinnen et al. | |
| 2006/0103826 A1 | 5/2006 | Kok et al. | |
| 2006/0109576 A1 | 5/2006 | Baba-Ali | |
| 2006/0146302 A1* | 7/2006 | Hauschild | 355/52 |
| 2006/0198013 A1 | 9/2006 | Sampsell | |
| 2006/0238737 A1* | 10/2006 | Nakauchi | 355/67 |
| 2006/0290910 A1 | 12/2006 | van de Kerkhof et al. | |
| 2007/0019175 A1* | 1/2007 | Ohsaki et al. | 355/55 |
| 2008/0309899 A1 | 12/2008 | Baselmans et al. | |
| 2009/0021748 A1 | 1/2009 | Latypov et al. | |

FOREIGN PATENT DOCUMENTS

| | | |
|---|---|---|
| EP | 1 482 371 A1 | 12/2004 |
| WO | WO 98/33096 A1 | 7/1998 |
| WO | WO 98/38597 A2 | 9/1998 |
| WO | WO 98/38597 A3 | 9/1998 |

OTHER PUBLICATIONS

Final Rejection mailed Aug. 24, 2011, directed to co-pending U.S. Appl. No. 11/763,275, filed Jun. 14, 2007; 11 pages.

Final Rejection mailed Mar. 12, 2010 for U.S. Appl. No. 11/763,275, 10 pgs.

International Search Report and Written Opinion for International Application No. PCT/EP2008/005086 mailed Sep. 30, 2008, 10 pgs.

International Search Report and Written Opinion for International Application No. PCT/EP2008/005086 mailed Sep. 30, 2008; 10 pages.

Final Rejection mailed Mar. 12, 2010, directed to co-pending U.S. Appl. No. 11/763,275, filed Jun. 14, 2007; 10 pages.

Non-Final Rejection mailed Apr. 1, 2011, directed to co-pending U.S. Appl. No. 11/763,275, filed Jun. 14, 2007; 11 pages.

\* cited by examiner

LITHOGRAPHIC APPARATUS AND DEVICE MANUFACTURING METHOD USING PUPIL FILLING BY TELECENTRICITY CONTROL

BACKGROUND

1. Field of the Invention

The present invention relates to a lithographic apparatus and a method for manufacturing a device.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

Lithography requires a projection of patterns onto a substrate with high accuracy. In order to ensure that projection is achieved with high accuracy, various calibration measurements are made within the apparatus. In some instances, adjustments of the apparatus are made in response to these measurements.

Conventional lithographic apparatus use transmissive reticles. However, lithographic apparatus have been proposed which do not use transmissive reticles, instead using for example arrays of individually controllable elements, such as mirrors. In non-conventional lithographic apparatus such as these, conventional calibration measurement systems and methods may no longer be suitable, or may no longer be optimal Therefore, what is needed is a new measurement apparatus and method for a lithographic apparatus.

SUMMARY

In one embodiment of the present invention, there is provided a method of measuring aberration present in a lithographic apparatus comprising the following steps. Modulating a radiation beam using a reflective patterning device. Projecting the radiation beam using a projection system. Detecting the projected radiation using a sensor. Measuring aberration via interference in the detected radiation beam. The radiation beam is tilted away from the optical axis of the projection system prior to entering the projection system.

According to another embodiment of the present invention, there is provided a lithographic apparatus comprising a reflective patterning device, a projection system, a rotatable optical component, and a sensor. The reflective patterning device is configured to modulate a beam of radiation. The projection system is configured to project the modulated beam of radiation. The sensor is arranged to detect interference in the radiation projected by the projection system. The rotatable optical component is arranged to tilt the radiation beam away from an optical axis prior to the radiation beam being incident upon the reflective patterning device.

According to a further embodiment of the present invention, there is provided a lithographic apparatus comprising a reflective patterning device, a projection system, a rotatable optical element, and a sensor. The reflective patterning device is configured to modulate a beam of radiation. The projection system is configured to project the modulated beam of radiation. The sensor is arranged to detect interference in the radiation projected by the projection system. The rotatable optical component is arranged to tilt the radiation beam away from an optical axis prior to the radiation beam being incident upon the reflective patterning device.

According to a still further embodiment of the present invention, there is provided a method of measuring transmission of a projection system of a lithographic apparatus as a function of angle comprising the following steps. Reflecting a radiation beam using a reflective patterning device. Projecting the radiation beam using a projection system. Measuring the intensity of projected radiation using a sensor. A first intensity measurement is obtained with the radiation beam tilted in a first direction, away from the optical axis of the projection system, prior to entering the projection system. A second intensity measurement is obtained with the radiation beam tilted in a second direction, away from the optical axis of the projection system, prior to entering the projection system.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIGS. 1 to 4 schematically depict lithographic apparatus.

Figure 5:
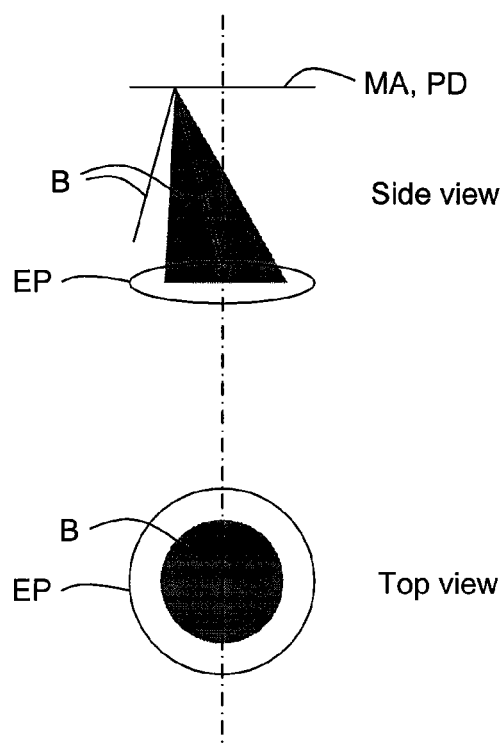
Figures 6A, 6B:
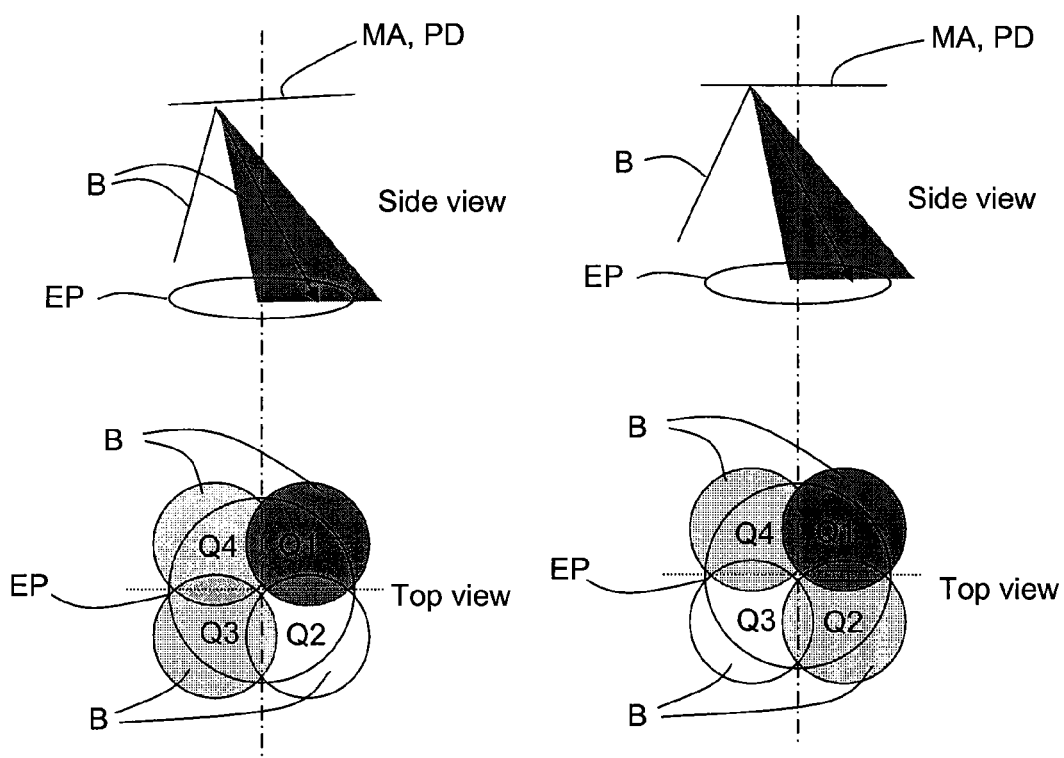

FIGS. 5, 6a, and 6b schematically depict embodiments of the invention.

Figure 7A:
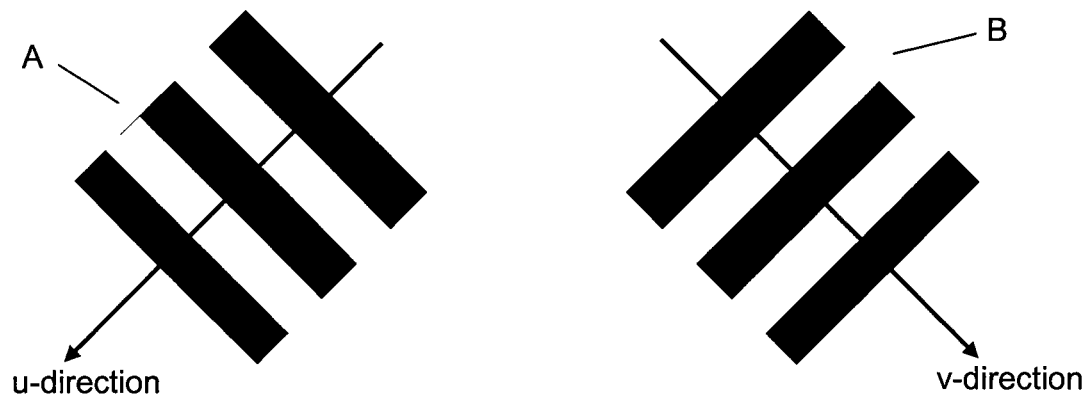
Figure 7B:
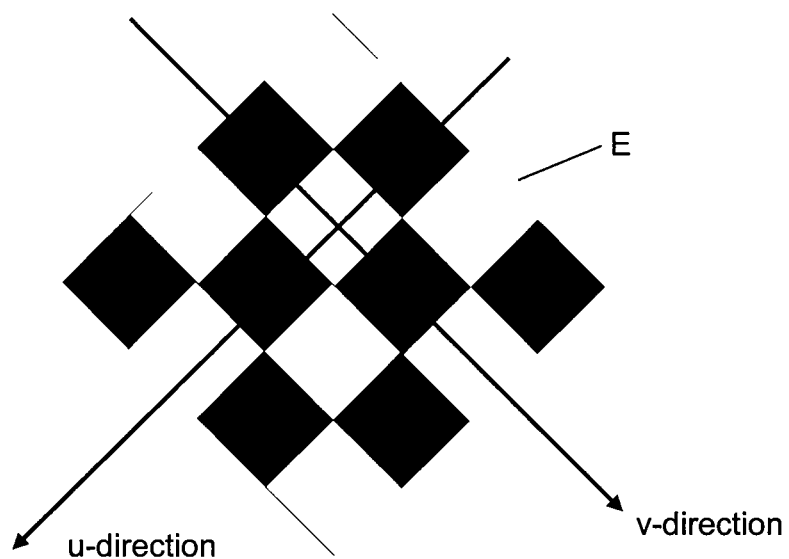

FIGS. 7a and 7b schematically depicts an exemplary operation.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

FIG. 1 schematically depicts the lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

It is to be appreciated that, although the description is directed to lithography, the patterned device PD can be formed in a display system (e.g., in a LCD television or projector), without departing from the scope of the present invention. Thus, the projected patterned beam can be projected onto many different types of objects, e.g., substrates, display devices, etc.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam cannot exactly correspond to the desired pattern in the target portion of the substrate, for example if the pattern includes phase-shifting features or so called assist features. Similarly, the pattern eventually generated on the substrate cannot correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100, 000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SiC, Ge, GaAs, InP, and InAs. The wafer can be: a III/V compound semiconductor wafer, a silicon wafer, a ceramic substrate, a glass substrate, or a plastic substrate. The substrate can be transparent (for the naked human eye), colored, or absent a color.

The thickness of the substrate can vary and, to an extent, can depend on the substrate material and/or the substrate dimensions. The thickness can be at least 50 µm, at least 100 µm, at least 200 µm, at least 300 µm, at least 400 µm, at least 500 µm, or at least 600 µm. Alternatively, the thickness of the substrate can be at most 5000 µm, at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA can be movable (e.g., with the use of one or more actuators) at least in the direction to and away from the substrate. Being able to move the MLA to and away from the substrate allows, e.g., for focus adjustment without having to move the substrate.

Figure 2:
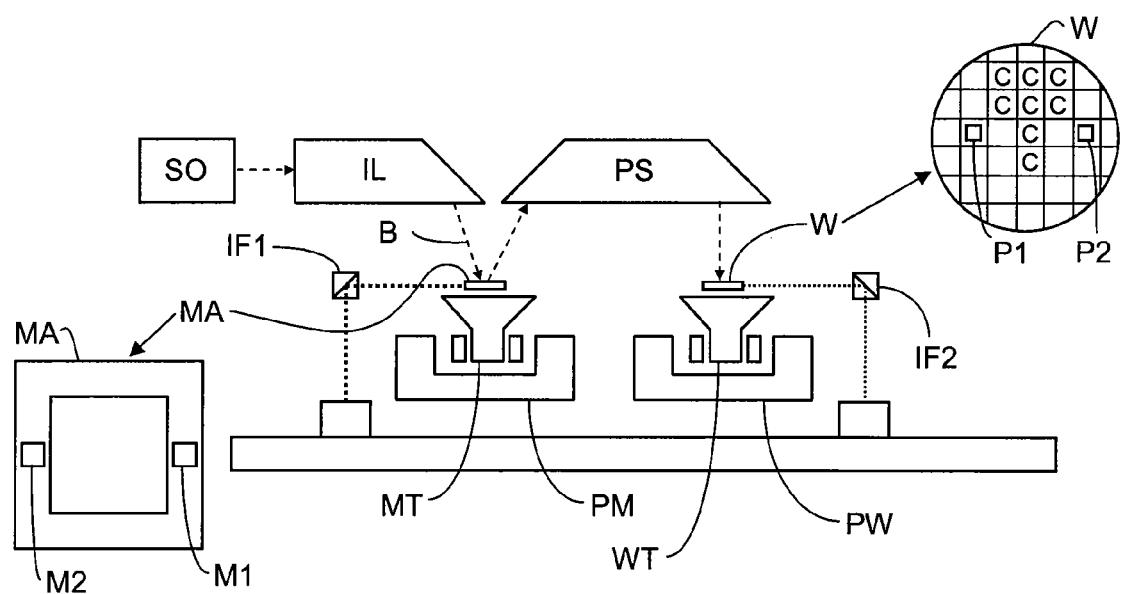

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation can have a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage cannot be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 cannot be required if a transmission patterning device is used.

The depicted apparatus can be used in several modes:

In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, or at least 256 different radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. The radiation dose profile can have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore control signals, representing the requisite states, must be transmitted to each of the individually controllable elements. These control signals are provided by the controller CR (FIG. 1). The pattern to be formed on the substrate may be provided to the lithographic apparatus in a vector-defined format such as GDSII. In order to convert the design information into the control signals for each individually controllable element, the controller includes one or more data manipulation devices, each configured to perform a processing step on a data stream that represents the pattern. The data manipulation devices may collectively be referred to as the "datapath".

The data manipulation devices of the datapath may be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

The lithographic apparatus may be formed from reflective components, as shown in FIG. 2. Reflective components may, for example, be used if the lithographic apparatus uses EUV radiation (e.g., having a wavelength in the range of 5-20 nm). FIG. 2 schematically depicts a lithographic apparatus according to an embodiment of the invention which is formed from reflective components. The apparatus comprises the following elements. An illumination system (illuminator) IL configured to condition a radiation beam B (e.g. UV radiation or EUV radiation). A support structure (e.g., a mask table) MT constructed to support a reflective mask MA and connected to a first positioner PM configured to accurately position the reflective mask in accordance with certain parameters. A substrate table (e.g., a wafer table) WT constructed to hold a substrate (e.g. a resist coated wafer) W and connected to a second positioner PW configured to accurately position the substrate in accordance with certain parameters. A projection system (e.g., a refractive projection lens system) PS configured to project a pattern imparted to the radiation beam B by the reflective mask MA onto a target portion C (e.g., comprising one or more dies) of the substrate W.

FIG. 2 shows a typical reflective mask MA in plan view. The reflective mask MA includes a central area which is provided with a functional pattern to be projected onto the substrate W, and two alignment marks M1, M2. The mask alignment marks M1, M2 are used in conjunction with substrate alignment marks P1, P2 to ensure that the reflective mask is properly aligned with the substrate W. The lithographic apparatus shown in FIG. 2 may be provided with at least some of the features described above in relation to FIG. 1. Lithography requires the projection of patterns onto a substrate W with high accuracy. In order to ensure that projection is achieved with high accuracy, various calibration measurements are made within the lithographic apparatus. In some instances adjustments of the lithographic apparatus are made in response to these measurements.

One of the calibration measurements that is performed in a conventional lithography apparatus is a measurement of the aberration present in the radiation beam projected by the projection system PS. One manner in which the aberration may be measured is by using lateral shearing interferometry. In shearing interferometry, a wavefront is separated into several copies, these copies are displaced laterally with respect to one another, and interference between them is recorded. Analysis of the interference is used to monitor aberrations within the radiation beam. In one embodiment of the present invention, shearing interferometry is performed within a maskless lithographic apparatus or a reflective mask-based lithographic apparatus.

Figure 3:
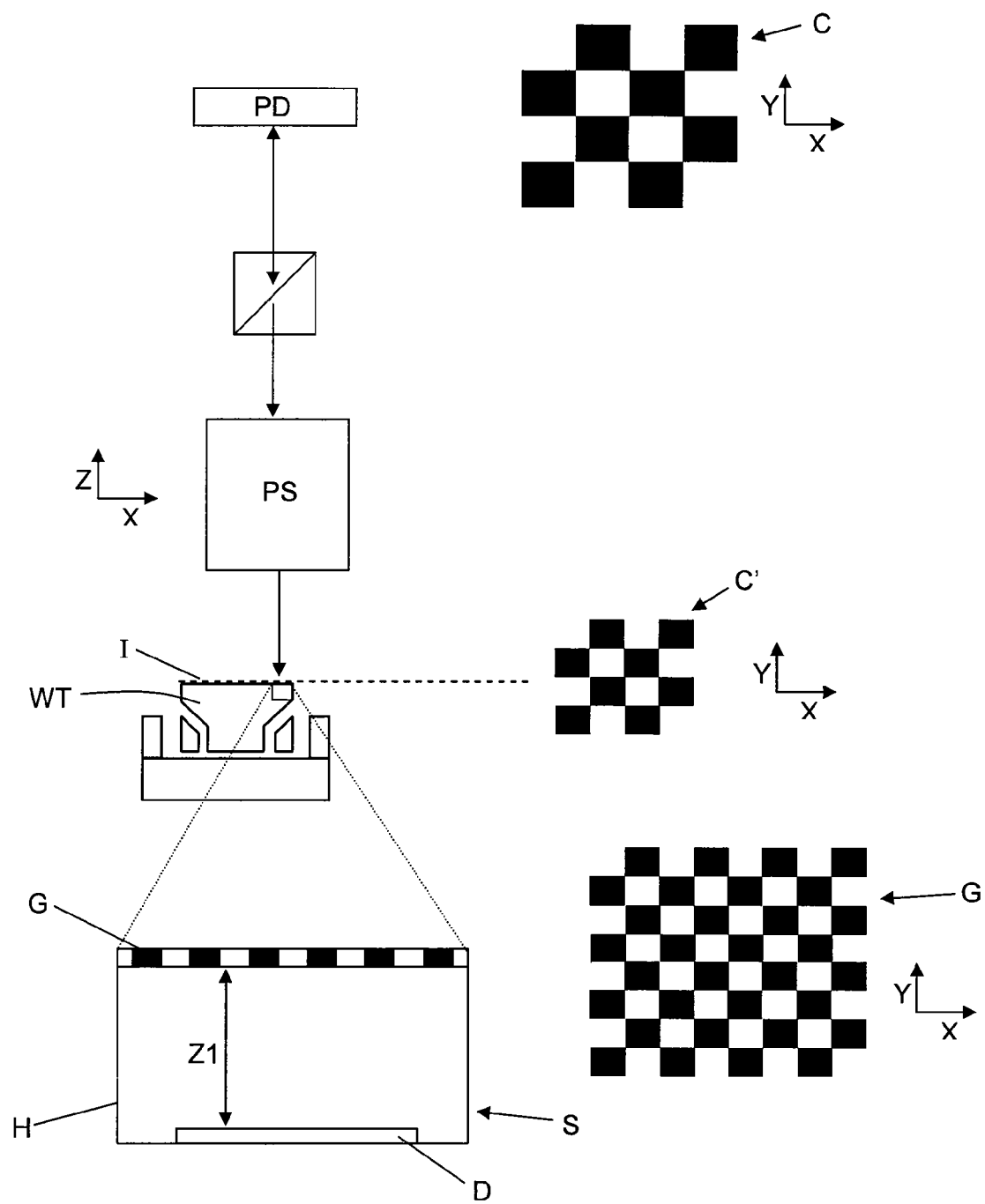

FIG. 3 shows in more detail an example of part of the lithographic apparatus shown in FIG. 1. The substrate table WT is provided with a sensor S. The sensor S comprises a housing H containing a detector D (e.g., a CCD array). A diffraction grating G is attached to the housing H. The diffraction grating G comprises a checkerboard pattern provided on a quartz plate, and is located above the detector D. The diffraction grating G is a distance Z1 from the detector. The distance may, for example, be approximately 2.5 millimeters. The function of the diffraction grating G will be described further below.

A checkerboard pattern C is provided on the patterning device PD. Dark areas of the checkerboard pattern indicate areas where mirrors (or other individually controllable elements) direct radiation such that it does not pass through the projection system PS. White areas of the checkerboard indicate areas in which the mirrors of the patterning device are oriented such that radiation is directed into the projection system.

The projection system PS forms an image C' of the checkerboard pattern in an image plane I. In one example, the reduction factor of the projection system is 400. This means that the checkerboard image formed by the projection system is 400 times smaller than the checkerboard pattern formed by the mirrors. Since it is not practical to show a 400 times reduction in FIG. 3, a slight reduction of the checkerboard pattern is shown instead. The checkerboard pattern C may, for example, be approximately 16 millimeters across, with the image of the checkerboard pattern being about 40 microns across.

In use, the substrate table WT is moved, such that the grating G (which acts as a shearing grating) coincides with the image of the checkerboard pattern C'. The detector D is located in the far field of the projection system PS. The checkerboard pattern C has a limited spatial extent, as does the image of the checkerboard pattern C'. The limited spatial extent of the checkerboard pattern image C', and the separation Z1 of the detector D from the image plane of the projection system PS, mean that the sensor S acts as a pinhole camera. Interference from sheared wavefronts of the radiation beam is imaged on the detector D.

The substrate table WT is moved transverse to the radiation beam, such that it passes beneath the checkerboard pattern image C'. The detector D outputs a modulated signal, which is passed to a processor (not illustrated). The interaction between the checkerboard pattern image C' and the grating G provides a plurality of overlapping wavefronts. Interference between these wavefronts will occur, and aberrations present in the wavefronts will modify the resulting interference patterns. The processor can measure the aberration present in the radiation beam by detecting the phase of the first harmonic of the modulated signal.

Figure 4:
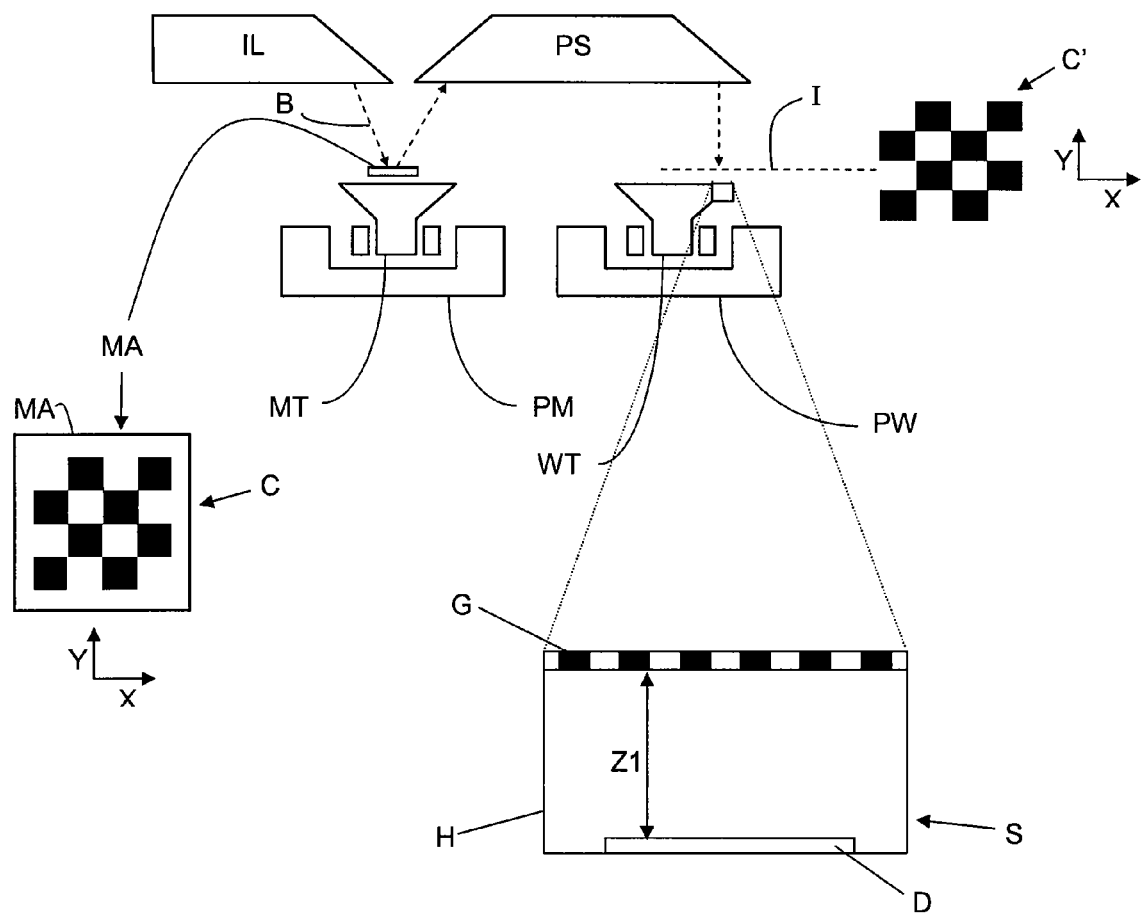

FIG. 4 shows in more detail an example of part of the lithographic apparatus shown in FIG. 2. The substrate table WT is provided with a sensor S. The sensor has the same construction as that shown in FIG. 3, and comprises a housing H containing a detector D (e.g., a CCD array). A diffraction grating G is attached to the housing H. The diffraction grating G comprises a checkerboard pattern provided on a quartz plate, and is located above the detector D. The diffraction grating G is a distance Z1 from the detector.

A checkerboard pattern C is provided on a mask MA. Light areas of the checkerboard pattern indicate areas where radiation is reflected from the mask MA into the projection system PS. Dark areas of the checkerboard pattern indicate areas where radiation is not reflected into the projection system.

The projection system PS forms an image C' of the checkerboard pattern in an image plane I. In one example, the reduction factor of the projection system is 4. This means that the checkerboard image formed by the projection system is 4 times smaller than the checkerboard pattern formed by the mirrors. The reduction of the checkerboard pattern is not shown in FIG. 4.

In use, in one example, the substrate table WT is moved such that the grating G (which acts as a shearing grating) coincides with the image of the checkerboard pattern C'. The detector D is located in the far field of the projection system PS. The checkerboard pattern C has a limited spatial extent, as does the image of the checkerboard pattern C'. The limited spatial extent of the checkerboard pattern image C', and the separation Z1 of the detector D from the image plane of the projection system PS, mean that the sensor S acts as a pinhole camera. Interference from sheared wavefronts of the radiation beam is imaged on the detector D.

The substrate table WT is moved transverse to the radiation beam, such that it passes beneath the checkerboard pattern image C'. The detector D outputs a modulated signal, which is passed to a processor (not illustrated). The interaction between the checkerboard pattern image C' and the grating G provides a plurality of overlapping wavefronts. Interference between these wavefronts will occur, and aberrations present in the wavefronts will modify the resulting interference patterns. The processor can measure the aberration present in the radiation beam by detecting the phase of the first harmonic of the modulated signal.

The spatial frequency of the checkerboard pattern C shown in the example of FIGS. 3 and 4 is low. This means that light reflected from the checkerboard pattern C into the projection system PS may not fill the entrance pupil of the projection system. FIG. 5 schematically illustrates this situation. The radiation beam B is reflected from the reflective mask MA (or array of individually controllable elements PD), and passes into the entrance pupil EP of the projection system. A black arrow is used to show the incident and reflected radiation beam, and grey shading is used to show the spatial extent of the radiation beam at the entrance pupil of the projection system.

Since the radiation beam does not fill the entrance pupil EP of the projection system PS, the radiation beam will not pass through all parts of the projection system before being incident upon the sensor S. Resulting aberration measurements will not be accurate, since the sensor cannot measure aberration for parts of the projection system through which the radiation beam has not passed.

An embodiment of the invention, which overcomes this problem, is shown schematically in FIG. 6a. The reflective mask MA (or array of individually controllable elements PD) is tilted such that the radiation beam is displaced towards an edge of the entrance pupil EP of the projection system (the radiation beam is tilted away from the optical axis of the projection system PS). The displacement is such that one quadrant Q1 (i.e., a quarter) of the entrance pupil is filled by the radiation beam. The radiation beam overlaps the edge of the entrance pupil, and overlaps into adjacent quadrants. The sensor S is positioned beneath the resulting pattern formed in the image plane of the projection system, and data is recorded.

The reflective mask MA (or array of individually controllable elements PD) is then tilted in a different direction, so that the radiation beam is moved to a different quadrant Q2 of the entrance pupil EP of the projection system. The sensor is again positioned beneath the resulting pattern formed in the image plane of the projection system, and data is recorded.

This process is repeated a third and fourth time, so that third and fourth quadrants Q3, Q4 of the entrance pupil of the projection system have been filled by the radiation beam.

The reflective mask MA (or array of individually controllable elements PD) is configured to be rotatable transverse to its optical axis, the rotation being arranged to tilt the radiation beam away from the optical axis of the projection system prior to entering the projection system. The reflective mask MA (or array of individually controllable elements PD) may, for example, be held on a pivoting mounting. Actuation of the reflective mask MA (or array of individually controllable elements PD) may be via electric motors, piezo-electric actuators, or any other suitable devices.

Filling of the entrance pupil is shown schematically in FIG. 6a, each of the four positions of the radiation beam B being shaded grey. The position of the radiation beam B which corresponds to that shown in the side view (i.e., filling the first quadrant Q1) is shaded in dark grey.

Once data has been obtained from measurements with the radiation beam filling each of the quadrants of the entrance pupil EP, the data is combined together in order to obtain a map of the aberration present in the projection system PS.

The angle through which the reflective mask MA (or array of individually controllable elements PD) should be tilted may be determined using trigonometry, based upon the size of the entrance pupil, the size of the radiation beam at the entrance pupil, and the distance between the entrance pupil and the reflective mask MA (or array of individually controllable elements PD). In one example the tilt required may be about 1.5 milliradians.

The embodiment of the invention shown in FIG. 6a may be used with the lithographic apparatus shown in FIGS. 1 and 3, or with the lithographic apparatus shown in FIGS. 2 and 4.

In an alternative embodiment of the invention, shown schematically in FIG. 6b, the reflective mask MA (or array of individually controllable elements PD) is not tilted. Instead, the radiation beam B is tilted such that it is displaced towards an edge of the entrance pupil EP of the projection system. Tilting of the radiation beam may be achieved, for example, by moving an optical component of the lithographic apparatus (for example rotating a mirror). The optical component may be located in the illumination system IL of the lithographic apparatus. The displacement caused by tilting of the radiation beam is such that a first quadrant Q1 of the entrance pupil EP is filled by the radiation beam. The radiation beam overlaps the edge of the entrance pupil, and overlaps into adjacent quadrants. The sensor S is positioned beneath the resulting pattern formed in the image plane of the projection system, and data is recorded.

The radiation beam is then tilted in a different direction, so that the radiation beam is moved to a second quadrant Q2 of the entrance pupil of the projection system. The sensor is again moved beneath the resulting pattern formed in the image plane of the projection system, and data is recorded.

This process is repeated a third and fourth time, so that third and fourth quadrants Q3, Q4 of the entrance pupil of the projection system have been filled by the radiation beam.

The optical component is configured to be rotatable transverse to its optical axis, the rotation being arranged to tilt the radiation beam away from the optical axis of the projection system prior to entering the projection system. The optical component may, for example, be held on a pivoting mounting. Actuation of the optical component may be via electric motors, piezo-electric actuators, or any other suitable means. The optical component may comprise a mirror.

Filling of the entrance pupil is shown schematically in FIG. 6b, each of the four positions of the radiation beam B being shaded grey. The position of the radiation beam B, which corresponds to that shown in the side view (i.e., filling the first quadrant Q1), is shaded in dark grey.

Once data has been obtained from all of the measurements, the data is combined together in order to obtain a map of the aberration present in the projection system.

The embodiment of the invention shown in FIG. 6b may be used with the lithographic apparatus shown in FIGS. 1 and 3, or with the lithographic apparatus shown in FIGS. 2 and 4.

As mentioned in the descriptions of FIGS. 6a and 6b, measurements for each of the four quadrants Q1-Q4 are combined together in order to obtain a map of the aberration present in the projection system. Each aberration measurement will be associated with a particular location in the image plane beneath the projection system. In some locations more than one aberration measurement will have been made. Where this has occurred, the measurement will comprise the same aberration value recorded twice, and the value can be easily included in the aberration map. If two different aberration values are recorded (for example, due to measurement noise), then an average of the values is determined. It is this average value which is used in the aberration map.

In some instances the radiation beam may not be sufficiently large that it can be used to fill the entrance pupil by moving it to four different positions. Where this is the case more than four positions may be used to fill the entrance pupil. Indeed, any number of positions of the radiation beam at the entrance pupil may be used to fill the entrance pupil.

In addition to providing a measurement of the aberration present in the projection system, tilting of the radiation beam may also be used to measure the apodization of the projection system. This may be measured by tilting the radiation beam in the manner described above, then comparing the intensity of radiation transmitted by the projection system with the intensity of radiation that is transmitted when the beam is not tilted. This intensity measurement may also be used to measure the numerical aperture of the projection system (i.e., to determine when radiation is clipped in the pupil plane of the projection system).

In general, tilting of the radiation beam in the manner described above may be used to obtain a measure of the transmission of the projection system as a function of angle.

FIG. 7 shows schematically an example in which the sensor S is moved beneath the checkerboard pattern in order to measure aberration. In order to explain more easily the manner in which the aberration measurement is obtained, FIG. 7a shows a pair of patterns which are simpler than the checkerboard pattern. A first pattern A comprises a series of lines spaced apart in the u-direction. This pattern is provided on the reflective mask MA (or array of individually controllable elements PD).

The sensor S is stepped in the u-direction, beneath an image of the pattern. One image is recorded per step, and the intensity of the image is recorded as a function of the stepped distance. Stepping in this manner provides multiple interferograms with different phases. The phase of the first harmonic of the image intensity as a function of distance is determined. It is this phase that provides information about aberrations present in the projection system.

A second pattern B, which comprises a series of lines spaced apart in the v-direction is provided on the reflective mask MA (or array of individually controllable elements PD). The sensor is stepped in the v-direction beneath an image of the pattern, thereby providing a second set of aberration measurements in the v-direction.

Referring to FIG. 7b, instead of using two separate series of spaced lines, a checkerboard pattern E may be used (as mentioned further above). The checkerboard pattern allows aberration measurements to be performed for the u and v directions without having to modify the pattern between measurements.

The aberration measurement is performed in a manner which is similar to that described above in relation to FIG. 7a. However, in this case in addition to stepping movement in one direction (e.g., the u-direction), scanning movement takes place in the other direction (e.g., the v-direction). The scanning movement takes place during each intensity measurement, and is used to average out one dimension of the checkerboard structure, so that the resulting aberration measurement is in one direction only (in this case the u-direction).

Although the patterns shown in FIG. 7 have well defined edges (i.e., there are sharp transitions between light areas and dark areas), it is not essential that this is the case. For example, there may be gradual transitions between light areas and dark areas. In one example, the patterns may be in the form of cosine functions.

Where a pattern in the form of a cosine function is used, determining the first harmonic of the modulated signal output by the detector D becomes easier. This is because the modulated signal does not include significant amounts of other harmonics. If patterns with well defined edges are used, e.g., as shown in FIG. 7, then many other harmonics may be present. Where this is the case, denser sampling of the modulated signal may be needed in order to obtain accurate aberration measurements.

In general, a pattern that includes a repeating structure is used, in order that interference with sufficient contrast is seen at the detector D. The interference pattern should have sufficient contrast to allow it to be detected accurately by the detector.

The period of the grating G may be selected such that the contrast and intensity of the interferograms seen at the detector D are optimal. For example, if two separated illumination points are present at the patterning device PD (e.g., a dipole illumination mode), then two interferograms will be generated by the grating G. If the period of the grating G is selected such that it is the same as the separation between the two illumination points (as seen in the image plane I), then the interferograms will add together constructively. This provides a signal with strong contrast. On the other hand, if the period of the grating G is half of the separation between the two illumination points, then the interferograms will add together destructively thereby giving a signal with little or no contrast.

If a linear grating is used instead of a checkerboard grating, the period of the grating may be selected to provide a strong signal to noise ratio.

Where a pattern in the form of a cosine function is used on the patterning device, the grating may be in the form of a cosine function. Where this is done, period of the cosine function may be selected such that no contrast will be present in (unwanted) higher harmonics.

Measurement of the aberration present in the radiation beam may be performed at intervals. The time elapsed between aberration measurements may be selected based upon known characteristics of the lithographic apparatus, and may, for example, vary between different types or models of lithographic apparatus. The measurement may be, for example, performed after a batch (lot) of substrates has passed through the lithographic apparatus. A batch may typically be 20-25 substrates. The measurement may be performed around 6 times per hour, or at any other interval.

Although described embodiments of the invention refer to mirror arrays, any suitable array of individually controllable elements may be used.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g., a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A method of measuring aberration present in a lithographic apparatus, comprising:
   modulating a radiation beam using a reflective patterning device;
   projecting the modulated radiation beam in a plurality of overlapping adjacent areas using a projection system;
   detecting the projected radiation beam using a sensor; and
   measuring an aberration via interference in the detected radiation beam;
   wherein the modulated radiation beam, as a whole, is tilted, by an optical component positioned along an optical axis of the projection system, to a plurality of different positions with respect to the optical axis of the projection system prior to entering the projection system, and
   wherein the combination of the plurality of different positions of the modulated radiation beam fills an entrance pupil of the projection system.

2. The method of claim 1, wherein the modulated radiation beam, as a whole, is tilted such that the modulated radiation beam overlaps an edge of the entrance pupil of the projection system.

3. The method of claim 1, wherein aberration is measured with the modulated radiation beam, as a whole, tilted to a first position with respect to the optical axis, and is then subsequently measured with the modulated radiation beam, as a whole, tilted to a second position with respect to the optical axis.

4. The method of claim 3, wherein, if different aberration measurements are obtained for a given location of the lithography apparatus, an average of the measurements is determined.

5. The method of claim 1, wherein the plurality of overlapping adjacent areas comprise quadrants of the entrance pupil.

6. The method of claim 1, wherein the modulated radiation beam is tilted by tilting the reflective patterning device as a whole.

7. The method of claim 1, wherein the optical component forms part of an illumination system of the lithographic apparatus.

8. The method of claim 1, wherein the reflective patterning device is a reflective mask or an array of individually controllable elements.

9. A lithographic apparatus, comprising:
   a reflective patterning device configured to modulate a beam of radiation;
   a projection system configured to project the modulated beam of radiation in a plurality overlapping adjacent areas; and
   a sensor arranged to detect interference in the radiation projected by the projection system;
   wherein the reflective patterning device is positioned along an optical axis of the projection system and configured to be rotatable transverse to its optical axis, the rotation being arranged to tilt the modulated radiation beam, as a whole, away from the optical axis of the projection system prior to entering the projection system,
   wherein the range of rotational movement of the reflective patterning device is sufficient that the modulated radiation beam, as a whole, is moved to a plurality of different positions, away from the optical axis of the projection system, at an entrance pupil of the projection system, such that the combination of different positions fills the entrance pupil of the projection system.

10. The lithographic apparatus of claim 9, wherein the range of rotational movement of the reflective patterning device is sufficient that the modulated radiation beam overlaps an edge of the entrance pupil of the projection system.

11. The lithographic apparatus of claim 9, wherein the reflective patterning device is a reflective mask or an array of individually controllable elements.

12. The apparatus of claim 9, wherein the plurality of overlapping adjacent areas comprise quadrants of the entrance pupil.

13. A lithographic apparatus, comprising:
   a reflective patterning device configured to modulate a beam of radiation;
   a projection system configured to project the modulated beam of radiation in a plurality of overlapping adjacent areas; and
   a sensor arranged to detect interference in the radiation projected by the projection system;
   wherein the lithographic apparatus further comprises a moveable optical component positioned along an optical axis of the projection system and arranged to tilt the radiation beam, as a whole, away from the optical axis, prior to the radiation beam being incident upon the reflective patterning device,
   wherein the range of rotational movement of the optical component is sufficient that the radiation beam, as a whole, is moved to as plurality of different positions at the entrance pupil of the projection system, such that the combination of different positions fills the entrance pupil of the projection system.

14. The lithographic apparatus of claim 13, wherein the optical component is a rotatable mirror.

15. The lithographic apparatus of claim 13, wherein the moveable optical component forms part of an illumination system of the lithographic apparatus.

16. The lithographic apparatus of claim 13, wherein the range of movement of the optical component is sufficient that the radiation beam overlaps an edge of an entrance pupil of the projection system.

17. The apparatus of claim 13, wherein the plurality of overlapping adjacent areas comprise quadrants of the entrance pupil.

18. A method of measuring transmission of a projection system of a lithographic apparatus as a function of angle, comprising:
   reflecting a radiation beam using a reflective patterning device;
   projecting the reflected radiation beam in a plurality of overlapping adjacent quadrant areas using a projection system; and
   measuring the intensity of projected radiation using a sensor;
   wherein a plurality of intensity measurements are obtained with the reflected radiation beam, as a whole, tilted, by an optical component positioned along an optical axis of the projection system, in a corresponding plurality of different directions, away from the optical axis of the projection system, prior to entering the projection system, and
   wherein the combination of the plurality of different directions cause the reflected radiation to fill an entrance pupil of the projection system.

19. The method of claim 18, wherein an apodization of the projection system or a numerical aperture of the projection system is measured.

\* \* \* \* \*

UNITED STATES PATENT AND TRADEMARK OFFICE
CERTIFICATE OF CORRECTION

PATENT NO.         : 8,692,974 B2
APPLICATION NO.    : 11/763274
DATED              : April 8, 2014
INVENTOR(S)        : Johannes Jacobus Matheus Baselmans Page 1 of 1

It is certified that error appears in the above-identified patent and that said Letters Patent is hereby corrected as shown below:

In the Claims

In claim 13, column 18, line 32, please delete "as" and insert --a--

Signed and Sealed this
Second Day of September, 2014

Michelle K. Lee
*Deputy Director of the United States Patent and Trademark Office*